(12) United States Patent
Bernier et al.

(10) Patent No.: US 6,791,808 B2
(45) Date of Patent: Sep. 14, 2004

(54) CLIPPING DEVICE WITH A NEGATIVE RESISTANCE

(75) Inventors: Eric Bernier, Mettray (FR); Robert Pezzani, Vouvray (FR)

(73) Assignee: STMicroelectronics S.A., Gentilly (FR)

( * ) Notice: Subject to any disclaimer, the term of this patent is extended or adjusted under 35 U.S.C. 154(b) by 336 days.

(21) Appl. No.: 09/747,780

(22) Filed: Dec. 22, 2000

(65) Prior Publication Data

US 2001/0005302 A1 Jun. 28, 2001

(30) Foreign Application Priority Data

Dec. 28, 1999 (FR) .............................. 99 16602

(51) Int. Cl.⁷ ................................ H02H 9/00
(52) U.S. Cl. ........................................ 361/56
(58) Field of Search .................. 361/56, 58; 327/568, 327/569, 570, 571, 583, 584, 169, 192, 193, 195, 196; 438/492, 931; 357/76, 75, 72, 79, 81; 257/46, 2, E47.001

(56) References Cited

U.S. PATENT DOCUMENTS

| | | | | |
|---|---|---|---|---|
| 4,262,295 A | * | 4/1981 | Okano et al. ............... | 257/589 |
| 4,405,932 A | * | 9/1983 | Ishii et al. .................. | 257/497 |
| 5,083,185 A | | 1/1992 | Hayashi et al. ............... | 357/38 |
| 5,374,843 A | * | 12/1994 | Williams et al. ............. | 257/492 |
| 5,751,531 A | * | 5/1998 | Rault .......................... | 361/56 |
| 5,929,502 A | | 7/1999 | Beasom ...................... | 257/497 |

FOREIGN PATENT DOCUMENTS

EP          0 881 693       12/1998     ......... H01L/29/886

OTHER PUBLICATIONS

French Preliminary Search Report from French application No. 99 16602, filed Dec. 28, 1999.
Patent Abstracts of Japan vol. 004, No. 103 (P–020), Jul. 23, 1980 and JP 55 061828.
U.S. application S.N. 09/083,355 filed on May 22, 1998 corresponding to EP 0 881 693, now abandoned.

* cited by examiner

*Primary Examiner*—Brian Sircus
*Assistant Examiner*—James A. Demakis
(74) *Attorney, Agent, or Firm*—Lisa K. Jorgenson; James H. Morris; Wolf, Greenfield & Sacks P.C.

(57) ABSTRACT

A clipping device intended for absorbing current peaks from 1 to 10 amperes, formed of a vertical NPN transistor, having an unconnected base, an emitter connected to a terminal on which positive voltage peaks are likely to appear, and a grounded collector, the transistor parameters being set so that it exhibits a negative dynamic resistance.

16 Claims, 2 Drawing Sheets

CLIPPING DEVICE WITH A NEGATIVE RESISTANCE

BACKGROUND OF THE INVENTION

1. Field of the Invention

The present invention relates to a device for protection against overvoltages.

2. Discussion of the Related Art

Conventionally, electronic circuits, for example integrated circuits, include a large number of inputs, and voltage peaks associated with overvoltages on the connection lines or with electrostatic discharges are likely to occur on each of these inputs. Thus, conventionally, as illustrated in FIG. 1, each of the sensitive inputs 2 of an integrated circuit 1 is associated with a protection device 3, which is shown in FIG. 1 in the form of an avalanche diode.

The sole case where a positive overvoltage is likely to occur on input 2 has been considered in FIG. 1. Conventionally, those skilled in the art will be able to provide systems enabling elimination of negative overvoltages.

Further, apart from protection devices of clipping type such as avalanche diode 3 illustrated in FIG. 1, there also exist breakover type devices in which, after an overvoltage, the voltage across the device drops to a value close to zero. An example of a breakover device is a Shockley diode. In practice, the user will choose to use a clipping device (avalanche diode) or a breakover device (Shockley diode) according to his needs and to the general circuit structure. Only clipping-type protection devices will be considered herein.

FIG. 2 shows the current-voltage characteristic of a clipping device, for which breakdown voltage VBR is on the order of 17 volts. Components capable of conducting relatively high currents are considered. Curves between 1 and 4 amperes have been shown as an example. The ideal curve of a clipping device would be the curve shown in dotted lines under reference 10. In practice, a clipping component always has a certain positive dynamic resistance, and the phenomenon is enhanced for a given component when heating up. Thus, for example, a component having a breakdown voltage of 17 volts will see the clipping voltage thereacross, $V_{CL}$, increase to for example 20 volts when the current flowing therethrough reaches four amperes. This increase of the actual voltage across clipping components is a significant disadvantage. Indeed, the component's breakdown voltage is chosen while taking account of two limits. Voltage $V_{BR}$ must be greater than the maximum normal voltage likely to reach input terminal 2. On the other hand, it must be smaller than the voltages capable of damaging the components located behind input 2. In fact, in many cases, this margin is very reduced. Further, current standards require protection of certain circuits against particularly high overvoltages capable of conducting relatively intense currents in the protection device. It is thus important to avoid as much as possible that the voltage across the clipping component after its avalanching becomes greater than the chosen breakdown voltage $V_{BR}$.

A solution to reduce the difference between voltages VCL and VBR consists of increasing the diode surface. Indeed, a diode having a surface five times larger than another one will exhibit, for a given current, a difference $V_{CL}-V_{BR}$ five times as small, but it will cost substantially five times as much.

SUMMARY OF THE INVENTION

An object of the present invention is to solve this problem.

To achieve this and other objects, the present invention provides a clipping device intended for absorbing current peaks from 1 to 10 amperes, formed of a vertical NPN transistor having an unconnected base, an emitter connected to a terminal on which positive voltage peaks are likely to appear, and a grounded collector, the transistor parameters being set so that it exhibits a negative dynamic resistance.

According to an embodiment of the present invention, the base resistance is smaller than 1500 ohms/square.

According to an embodiment of the present invention, the relative arrangement of the emitter and of the base is such that the breakdown occurs in volume.

According to an embodiment of the present invention, the emitter extends beyond the base and the emitter periphery is surrounded with a P-type region more lightly doped than the base.

According to an embodiment of the present invention, the base extends beyond the emitter, the emitter periphery being formed of a lightly-doped N-type region.

It should be noted that it has already been provided to use an NPN transistor operating as a diode, its base being unconnected, and a positive voltage with respect to the collector being applied to the emitter, for example in European patent application EP-A-088 1693 (B3564) or in Japanese patent application 5561828 filed on Nov. 1, 1978. Both of these applications are hereby incorporated by reference. However, these documents provide the use of such components as a voltage reference. There is thus in fact no relation with the envisaged applications. Indeed, a voltage reference is intended for exhibiting a very vertical characteristic, similar to characteristic 10 shown in FIG. 2, but only over a current range from a few microamperes to a few milliamperes while the present invention relates to protection components that can conduct currents of several amperes. The transistors provided in the two mentioned documents would in fact have, for currents on the order of one ampere, a clipping characteristic with a positive dynamic resistance.

The foregoing objects, features and advantages of the present invention, will be discussed in detail in the following non-limiting description of specific embodiments in connection with the accompanying drawings.

DETAILED DESCRIPTION

Figures 3A, 3B, 3C:
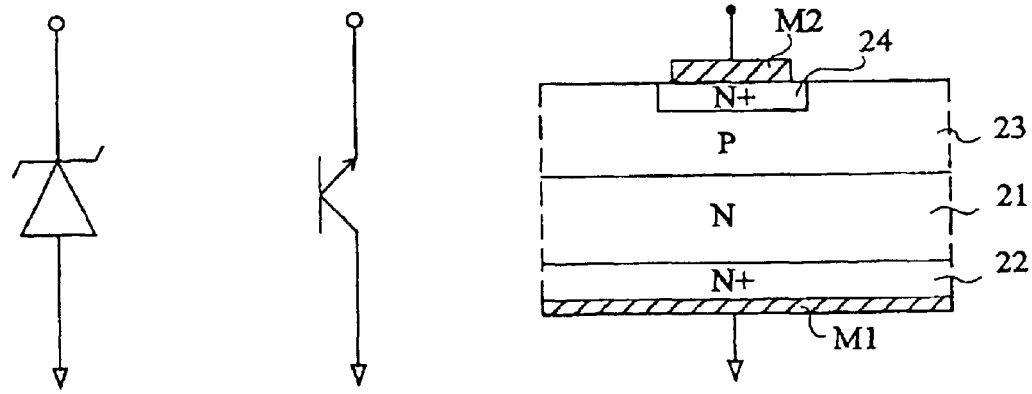
FIG. 3A shows a simplified view of a clipping component.
FIG. 3B symbolically shows a clipping component according to the present invention.
FIG. 3C shows a simplified cross-section view of a clipping component according to the present invention.

The present invention aims at forming a clipping component, the symbol of which corresponds to that shown in FIG. 3A, for which the voltage drop after breakdown VCL is very slightly greater than breakdown voltage VBR or even, preferably, is smaller than voltage VBR, without, however, falling back to zero as in the case of a breakover component.

For this purpose, the present invention provides using a transistor with no base connection such as illustrated in FIG. 3B in specific conditions. This transistor is used in the direction opposite to the usual direction. The collector terminal of the transistor is grounded and corresponds to the anode of the avalanche diode and the emitter terminal of the transistor is connected to a point that receives a positive high voltage pulse and corresponds to the cathode of the avalanche diode. Thus, an NPN transistor structure such as very schematically shown in FIG. 3C will be used, which includes an N-type substrate 21 corresponding to the transistor collector and which includes on its rear surface side an overdoped region 21, forming one piece with a metallization M1. On the upper surface side are formed a P-type base layer 23 and an N-type emitter layer 24 forming one piece with a metallization M2. Metallization M1 is normally connected to ground and metallization M2 is connected to a terminal to be protected, which is likely to receive a positive overvoltage.

Figure 4A:
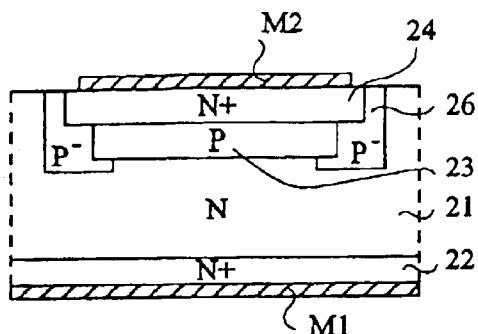
FIGS. 4A and 4B show alternative embodiments of a clipping component according to the present invention.
Figure 4B:
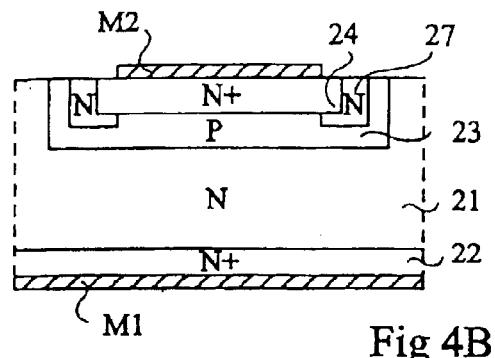

Preferably, to further a volume breakdown of the emitter-base junction, a structure such as shown in FIG. 4A or 4B will be chosen. Indeed, experiments have shown that the component according to the present invention provides satisfactory effects only if a volume breakdown of the emitter-base junction can be guaranteed.

In the embodiment of FIG. 4A, emitter layer 24 completely covers base layer 23 and the peripheries of the base and emitter regions are surrounded with a lightly-doped P-type region 26.

In the case of FIG. 4B, base region 23 greatly extends beyond emitter region 24 and the periphery of this emitter region is surrounded with a lightly-doped N-type ring 27.

The arrangements of FIGS. 4A and 4B are known to further a volume breakdown of the emitter-base junction and are likely to have various alternatives. For example, P region 26 in FIG. 4A or base region 23 in FIG. 4B may extend to the component periphery if the shown component is a specific component and not a portion of a monolithic component including several elementary components, among which that shown in FIG. 4A or 4B.

According to another aspect of the present invention, the doping of the intrinsic base region, that is, of the portion of P-type region 23 located under emitter region 24, must be chosen within a predetermined range. In particular, it is advocated to choose an intrinsic base region having a doping level corresponding to a resistance under 1500 ohms/square.

Figure 1:
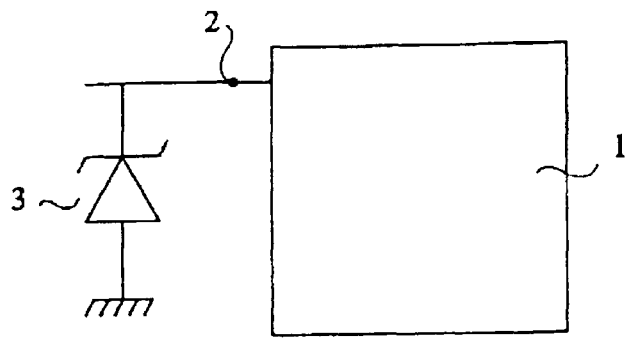
FIG. 1 shows the conventional use of a protection component.
Figure 2:
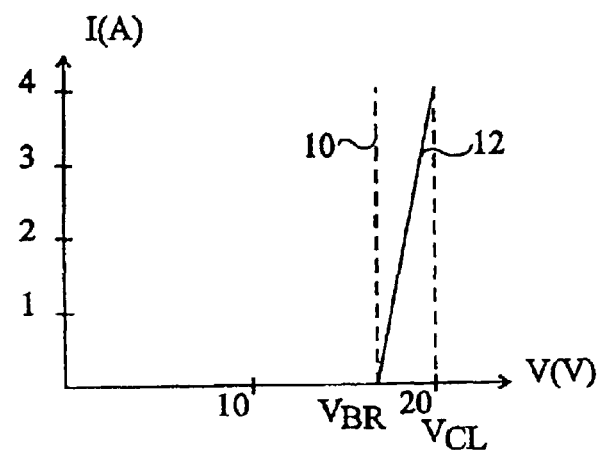
FIG. 2 shows the conventional characteristic of a clipping component.
Figure 5:
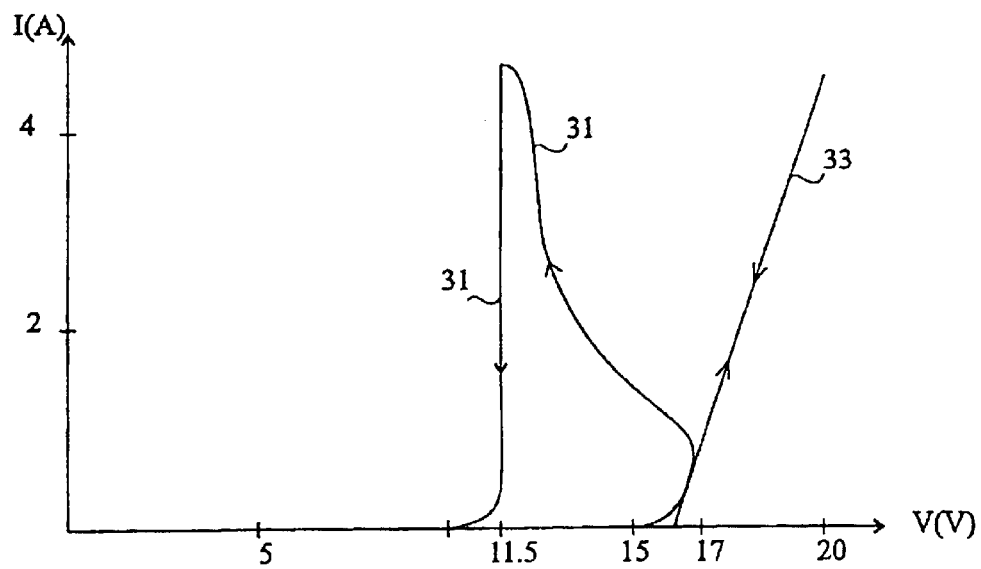
FIG. 5 shows current-voltage characteristics of clipping components according to the present invention.

FIG. 5 illustrates the result of simulations performed by the applicant on structures of the type of that in FIG. 3C:

for a resistance of an intrinsic base, or more exactly of a base pinched under the emitter, on the order of 1500 ohms/square, the curve designated by reference 31 has been obtained; that is, during the presence of the pulse, the current in the transistor would rise to a value slightly greater than four amperes to vertically reduce; during the current increase phase, the voltage across the transistor. Instead of increasing as in the case of a conventional clipping device, the characteristic of which is shown in FIG. 2, the voltage across the device of the present invention decreases to reach a value on the order of 11.5 V; at the end of the pulse, the voltage decrease is substantially vertical; in other words, the current-voltage characteristic exhibits a negative dynamic resistance;

with the same configuration, for a resistance per square of the intrinsic base region on the order of 2200 ohms/square, a positive dynamic resistance illustrated by curve 33, which is very similar to curve 12 of FIG. 2, has been obtained.

It should be noted that in all these curves, the initial portion, for very low current values, under 100 milliamperes, is not shown and thus the characteristics of reference diodes shown in the above-mentioned patent applications do not appear in these curves. Besides, these characteristics do not seem to be obtained herein, since in the above-mentioned patent applications, the base resistance is much higher.

Figure 6:
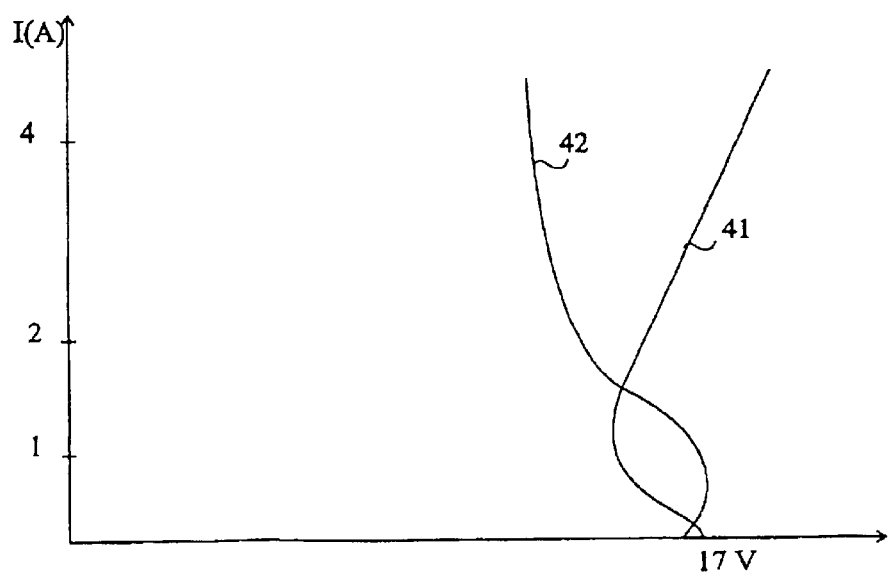
FIG. 6 shows current-voltage characteristics of clipping components according to the present invention.

Further, it should be clear that if the number of squares occupied by the component is increased, the resistance thereof will decrease and the component power consumption is further reduced. For example, in FIG. 6, curve 41 corresponds to a transistor according to the present invention having a pinched base resistance on the order of 600 ohms/square. It should be noted that the negative resistance area is left as soon as the current flowing through the transistor reaches a value on the order of 1 ampere. Conversely, for a 140-square long transistor, the corresponding curve will be curve 42 in which the resistance remains negative until a current value greater than 4 amperes is reached. The current range in which the negative dynamic resistance effect is maintained can thus be set by an adequate sizing: the more the number of squares is increased, the more the current range in which the negative dynamic effect is maintained is increased.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A clipping device formed of a vertical NPN transistor having an unconnected base, an emitter connected to a terminal on which positive voltage peaks are likely to appear, and a grounded collector, the transistor parameters being set so that the transistor exhibits a negative dynamic resistance at least for currents greater than about 1 ampere.

2. The device of claim 1, wherein the base resistance is smaller than 1500 ohms/square.

3. The device of claim 1, wherein the relative arrangement of the emitter and of the base is such that the breakdown occurs in volume.

4. A clipping device intended for absorbing current peaks from 1 to 10 amperes, formed of a vertical NPN transistor, having an unconnected base, an emitter connected to a terminal on which positive voltage peaks are likely to appear, and a grounded collector, the transistor parameters being set so that it exhibits a negative dynamic resistance, wherein the relative arrangement of the emitter and of the base is such that the breakdown occurs in volume, and wherein the emitter extends beyond the base and the emitter periphery is surrounded with a P-type region more lightly doped than the base.

5. The clipping device of claim 3, wherein the base extends beyond the emitter, the emitter periphery being formed of a lightly-doped N-type region.

6. A clipping device to protect a circuit from overvoltages, the clipping device comprising:

a first contact arranged for connection to the circuit;

a second contact arranged for connection to a reference potential; and a semiconductor component coupled between the first and second contacts and adapted to break down when an overvoltage is applied to the first contact;

wherein the clipping device exhibits a negative dynamic resistance after breakdown of the semiconductor component at least for currents in a range from 1 to 10 amperes.

7. The clipping device of claim 6, wherein the semiconductor component includes a first PN junction and a second PN junction arranged to form a vertical transistor.

8. The clipping device of claim 7, wherein the first PN junction is formed between an emitter region electrically coupled to the first contact and an unconnected base region, and the second PN junction is formed between the unconnected base region and a collector region electrically coupled to the second contact.

9. The clipping device of claim 8, wherein the emitter region has a first conductivity type and a first doping level and the base region has a second conductivity type and a second doping level.

10. The clipping device of claim 9, wherein the emitter region extends beyond the base region in a horizontal direction.

11. The clipping device of claim 10, further comprising a ring-shaped region of the second conductivity type formed at least around the horizontal periphery of the emitter region, the ring-shaped region having a third doping level less than the second doping level.

12. The clipping device of claim 9, wherein the base region extends further than the emitter region in a horizontal direction.

13. The clipping device of claim 12, further comprising a ring-shaped region of the first conductivity type formed at least around the horizontal periphery of the emitter region, the ring-shaped region having a third doping level less than the first doping level.

14. The clipping device of claim 6, wherein the range is between 1 and approximately 5 amperes.

15. The clipping device of claim 6, wherein the semiconductor component comprises a vertical NPN transistor having an unconnected base.

16. The clipping device of claim 1, wherein the transistor parameters are set so that the transistor exhibits a negative dynamic resistance at least for currents in a range from 1 to 10 amperes.

* * * * *